United States Patent

Krausser

[15] 3,706,041

[45] Dec. 12, 1972

[54] AUTOMATIC TUNING CIRCUIT

[72] Inventor: Friedrich Johann Krausser, Jericho, N.Y.

[73] Assignee: Emerson Electric Co., St. Louis, Mo.

[22] Filed: Oct. 20, 1970

[21] Appl. No.: 82,400

[52] U.S. Cl. ..................325/422, 325/464, 325/470, 334/16

[51] Int. Cl. ..............................................H04b 1/32

[58] Field of Search......325/422, 456, 464, 465, 468, 325/470, 469; 334/11, 14, 15, 16

[56] References Cited

UNITED STATES PATENTS

| | | | |
|---|---|---|---|
| 3,575,662 | 4/1971 | Davisson | ...................325/470 |
| 3,560,858 | 2/1971 | Sakai | .........................325/470 |

*Primary Examiner*—Robert L. Griffin

*Assistant Examiner*—Kenneth W. Weinstein

*Attorney*—Darby & Darby

[57] ABSTRACT

An automatic tuning device for use with a radio receiver includes a capacitor for storing a voltage which determines the frequency to which the device is tuned, means for charging the capacitor, and a control element connected across the capacitor for preventing further charging or discharging of the capacitor after the receiver has been properly tuned. When it is desired to tune the receiver to a new station, an advance switch is actuated, causing the enabling voltage from the control device to be removed so that the capacitor can be further charged. When the capacitor has been charged to a voltage corresponding to the high end of the frequency band, a unijunction transistor across the capacitor is fired, causing the capacitor to discharge to a voltage corresponding approximately to the lowest frequency in the band of interest.

6 Claims, 1 Drawing Figure

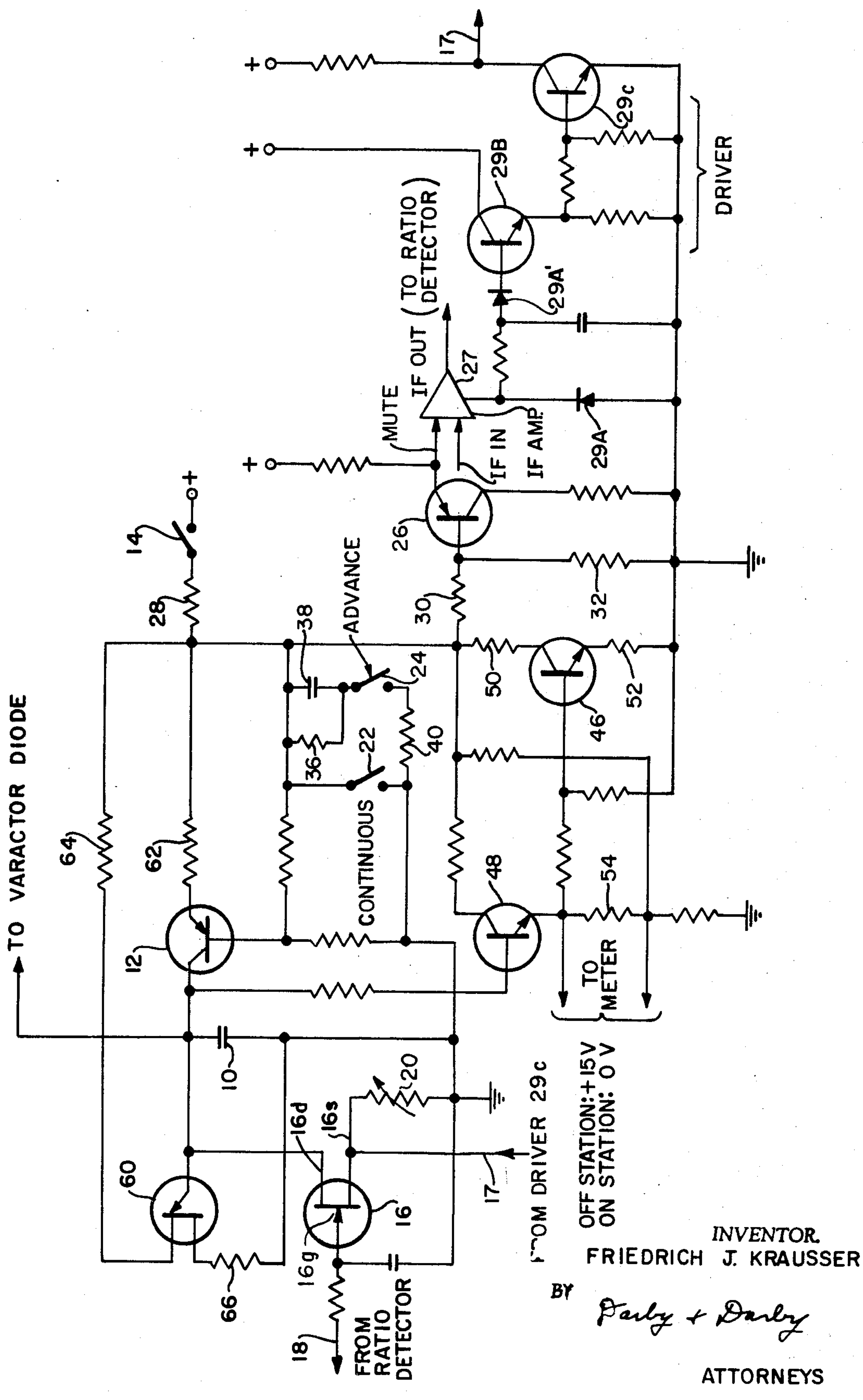
INVENTOR.
FRIEDRICH J. KRAUSSER
BY Darby & Darby
ATTORNEYS

AUTOMATIC TUNING CIRCUIT

This invention relates to devices for automatically tuning electronic circuits. More specifically, the present invention relates to a device for automatically tuning a radio receiver of the type employing voltage-variable capacitors.

The present invention is intended specifically to be used with a commercial radio receiver in which the user can automatically tune the receiver by actuating a switch on the receiver console. According to the invention, the user may cause the receiver to automatically tune to the next highest station or to move continuously to a general range of interest within the frequency band, at which point, upon release of the actuating switch, the receiver will automatically tune to the adjacent highest station. The invention provides a relatively simple, but highly reliable circuit for automatically tuning an electronic device such as a radio receiver.

Briefly, in accordance with the invention, a tuning voltage is stored in a capacitor which is charged by means of a constant current generator. A variable impedance, solid-state semi-conductor control element is connected across the capacitor and prevents further charging or discharging of the capacitor when the receiver has been tuned on station. When it is desired to move to the next highest station, actuation of an advance switch de-energizes the control element for a predetermined time interval during which the tuning voltage stored in the capacitor increases. When the tuning voltage reaches a preselected level corresponding to the high end of the frequency band, a trigger circuit is energized, causing the capacitor to discharge to a voltage corresponding approximately to the tuning voltage required to tune the device at the low end of the frequency band.

The invention is described in further detail below with reference to the attached drawing which is a schematic diagram of a preferred embodiment of a circuit embodying the invention.

In the drawing, a storage capacitor is shown at 10. It is charged by means of a constant current source comprising a PNP transistor 12, the emitter of which is connected to a positive source of direct voltage (for example 35.6 volts) through an on-off switch 14. In practice, switch 14 will be accessible from the console of the receiver and will function to place the receiver in the automatic scanning or tuning mode.

The present invention, though not so limited, is intended specifically to be used in conjunction with a tuning circuit which includes a so-called varactor diode. These are known devices, the capacitance of which varies in proportion to the voltage impressed across it to provide a convenient and simple way to tune a receiver or other device. In the circuit diagram, the tuning voltage coupled to the varactor diode is taken directly across the capacitor 10 as indicated on the drawing.

The charge on capacitor 10 is regulated by a field effect transistor (FET) 16 having its drain and source electrodes **16*d* and 16*s* connected in shunt across capacitor 10. The gate electrode 16*g* is coupled to a terminal 18 which receives the output of a standard symmetrical ratio detector (for example) in the receiver. Ratio detectors are well-known devices which produce a zero output signal when the receiver is exactly tuned to a desired station and a positive or negative output signal if the receiver is slightly tuned off station. Thus, when the receiver is correctly tuned, the absence of a signal on the gate electrode 16*g* causes the transistor 16 to conduct to provide a shunt path around capacitor 10. Hence, the FET serves as a means for preventing a charge on the capacitor from accumulating after the receiver is tuned. Variable resistor 20 serves as a means for adjusting the load current through the transistor 16 so that it is equal to the charging current provided by the constant current generator transistor 12 minus the leakage current of capacitor 10. The source electrode 16*s* is also connected to a line 17** on which, as explained below, there is a close to zero voltage when the receiver is properly tuned to a broadcast frequency and a positive voltage (for example 10 to 15 volts) when the receiver is off-station.

The operation of the circuit as so far described is as follows. When the switch 14 is closed, the flow of current through transistor 12 starts to charge capacitor 10. The voltage across capacitor 10 is applied to the varactor diode (for example) to tune the receiver. During this tuning process, the positive voltage on the source electrode 16s (via line 17) of field effect transistor 16 prevents conduction of the transistor so that capacitor 10 can continue to charge. When the voltage across capacitor 10 rises the capacitance of the varactor diode is decreased and therefore the tuned frequency of the receiver rises toward a value which coincides with the frequency of a broadcast station. As soon as a station is received, the voltage on line 17 drops close to zero, causing conduction through FET 16 to increase, thus shunting current flow around capacitor 10 to ground. Consequently, capacitor 10 cannot be further charged and the receiver will remain in that particular condition. By maintaining the voltage across capacitor 10 constant, FET 16 provides a high degree of automatic frequency control. The variable resistor 20 in the source circuit may be adjusted so that the current flow through the FET 16 will be at the desired level to maintain a constant voltage across capacitor 10 when the receiver is on station.

When it is desired to tune the receiver to a new station, the shunt regulating circuit through FET 16 must be removed so that additional voltage can be applied to capacitor 10. In the preferred embodiment, two different modes of operation are provided. In one, the user actuates a switch which causes the circuit to scan continuously until the switch is deactuated. At that time, the automatic scanning circuit will locate the next highest station. In the second mode of operation, actuation of a switch causes the circuit to advance to the next highest station. The switches which serve these functions are shown at 22 and 24 in the drawing.

Actuation of either of switches 22 and 24 serves to apply an operating voltage to a normally cut-off intermediate frequency (IF) muting transistor 26, causing this transistor to commence conduction. When switch 14 is closed, transistor 26 is normally cut off by virtue of the voltages existing across suitably selected resistors 28, 30 and 32. When either of switches 22 or 24 is closed, the voltage at the junction of resistors 28 and 30 drops substantially toward ground (resistors 36 and 40 being relatively small), causing transistor 26 to conduct. When transistor 26 conducts, it functions, in a known way, to cut off one of the IF stages of the receiver, thus muting the IF signal during tuning.

The IF amplifier is shown diagrammatically at 27. The "Mute" input from transistor 26 cuts off the amplifier in a known way to prevent unpleasant sounds during tuning. Amplifier 27 conventionally is a multi-stage device. A signal from one stage is rectified by diodes 29A and 29A' and coupled by a driver consisting of emitter follower 29B and amplifier 29C to control line 17. Thus, a positive voltage will be produced on line 17 when transistor 26 is conducting (producing a muting signal) or the receiver is off station (in which case no IF signal exists). Conversely, the voltage on line 17 is zero when transistor 26 is cut off or the receiver is tuned on station. In practice, emitter follower 29B may also drive a tuning indicator (not shown) while amplifier 29C provides an audio muting signal which cuts off the audio signal when the receiver is off station.

If the switch 22 is actuated, as soon as it is released, transistor 26 will be cut off again but the positive signal on line 17 is maintained by the lack of an IF signal which keeps transistor 29 cut off. The system will then tune, as described above, to the first station at which the signal on line 17 returns to zero and the ratio detector output on terminal 18 is zero.

If the switch 24 has been actuated, a capacitor 38 will be connected to the positive voltage source. This capacitor will continue to charge through resistors 28 and 40 until the voltage across it reaches a level at which conduction through transistor 26 is again cut off. At this point the system is then able to tune itself as previously described.

The time during which the IF muting transistor 26 is conducting must be sufficiently long to permit the receiver to tune off of the station to which it was previously tuned. Additionally, it must be short enough to prevent station skipping, i.e., transistor 26 should conduct for no longer than the minimum period required to tune between the two closest-spaced stations. This interval is determined by the time required to charge capacitor 38 to the cutoff voltage for transistor 26 and can be determined in an obvious way by suitable selection of circuit parameters.

As noted previously, in the preferred embodiment, the tuning means for the receiver comprises a varactor diode. Varactor diodes are non-linear and exhibit a faster change of capacitance at low voltage than at high voltage. Consequently, transistor 26 must be maintained conductive for longer periods of time when tuning to stations at the higher end of the FM band. For this purpose, a variable time delay network is provided which insures that regardless of tuning frequency, the IF amplifier will be muted for a sufficiently long period to permit the automatic scanning operation to proceed, yet not for so long a period as to cause station skipping.

The variable release time circuit includes a transistor 46 having its collector-emitter circuit connected between ground and the positive side of capacitor 38. Conduction of transistor 46 is controlled by a driver transistor 48, the base of which is connected across capacitor 10 so as to be directly responsive to the tuning voltage coupled to the varactor diode. Transistor 48 operates as an emitter follower so that the base voltage applied to transistor 46 follows the actual tuning voltage applied to the varactor diode. Thus, the conduction of transistor 46 is controlled by the tuning voltage across capacitor 10. Conduction of transistor 46 provides a shunt path including the transistor and resistors 50 and 52 to the charging circuit for capacitor 38. Consequently, as the tuning voltage increases (indicative of higher frequencies) the increased conduction of transistor 46 lengthens the time required to charge capacitor 38 and thus increases the release time after switch 24 has been actuated. By way of example, the release time at 108 MHz may be 3 times longer than the release time at 88 MHz.

A meter may be connected across resistor 54 in the emitter circuit of emitter follower 48. The meter can be suitably calibrated to read frequency directly as a function of the current flow in resistor 54.

In accordance with the preferred embodiment of the invention, the circuit scans in only one direction, i.e., in a direction of increasing frequency. In the case of an FM receiver, when the receiver has been tuned to 108 MHz, it is necessary to return the tuner voltage to the voltage corresponding to 88 MHz. For example, this may require a change in voltage from 23.8 volts across capacitor 10 to 4.3 volts. This function, in accordance with the invention, is performed simply and efficiently by a unijunction transistor 60 having its current-carrying electrodes connected across the capacitor 10 and constant current generator transistor 12. As is well known, the unijunction transistor is a trigger type device which fires upon application of a preselected voltage to its base. The base of unijunction 60 is connected to the positive side of capacitor 10. Hence, when the voltage on capacitor 10 reaches 23.8 volts (corresponding to 108 MHz) the unijunction transistor 60 is fired, causing capacitor 10 to discharge through transistor 12, and resistors 62, 64 and 66 to ground. The values of these resistors will be selected so that the voltage across capacitor 10 will drop to a voltage slightly less than the voltage corresponding to 88 MHz. For example, the capacitor may discharge to 3 volts. The operation of the circuit then continues as described previously.

What is claimed is:

1. Apparatus for use in automatically tuning an electronic device having an IF stage for receiving an IF signal across a preselected frequency band comprising a capacitor for storing a voltage which determines the frequency to which said device is tuned;

current generating means for charging said capacitor;

a variable impedance solid state, semi-conductor control element connected across said capacitor for limiting the charge on said capacitor in response to an applied input voltage;

an advance switch for operatively connecting said capacitor and said current generating means;

means responsive to actuation of said advance switch for producing a muting signal; means responsive to said muting signal or the presence of said IF signal for generating said input voltage; means for maintaining said muting signal for a predetermined time interval after said advance switch is actuated, said time interval being long enough to enable the device to tune off of any frequency in the band but not so long as to cause the device to tune past a desired frequency in said band, and means responsive to a preselected voltage across said capacitor corresponding to the high end of said frequency band for discharging said capacitor to a voltage corresponding approximately to the low end of said frequency band.

2. Apparatus according to claim 1, wherein said means for discharging said capacitor comprises a unijunction transistor.

3. Apparatus according to claim 1, wherein said electronic device is a radio receiver having an intermediate frequency stage, and wherein said means for preventing includes means for cutting off said intermediate frequency stage.

4. Apparatus according to claim 3, further including means for varying said predetermined time interval, depending upon the frequency to which said receiver is tuning.

5. Apparatus according to claim 4, wherein said means for varying said time interval comprises a capacitor which is connected to a voltage source upon actuation of said advance switch, said means for preventing being disabled when the voltage across said second-named capacitor reaches a predetermined level and wherein there is further provided a continuous advance switch for alternatively enabling said preventing means, said continuous advance switch bypassing said second-named capacitor.

6. Apparatus according to claim 5, wherein said means for varying said time interval comprises a variable impedance means for varying the time required to charge said second-named capacitor, said variable impedance means including a solid-state control element responsive to the tuning voltage across said first-named capacitor.

* * * * *